US010468406B2

(12) United States Patent
Parke et al.

(10) Patent No.: US 10,468,406 B2
(45) Date of Patent: Nov. 5, 2019

(54) INTEGRATED ENHANCEMENT MODE AND DEPLETION MODE DEVICE STRUCTURE AND METHOD OF MAKING THE SAME

(71) Applicants: Justin Andrew Parke, Ellicott City, MD (US); Eric J. Stewart, Silver Spring, MD (US); Robert S. Howell, Silver Spring, MD (US); Howell George Henry, Ellicott City, MD (US); Bettina Nechay, Laurel, MD (US); Harlan Carl Cramer, Columbia, MD (US); Matthew Russell King, Linthicum, MD (US); Shalini Gupta, Falls Church, VA (US); Ronald G. Freitag, Catonsville, MD (US); Karen Marie Renaldo, Pasadena, MD (US)

(72) Inventors: Justin Andrew Parke, Ellicott City, MD (US); Eric J. Stewart, Silver Spring, MD (US); Robert S. Howell, Silver Spring, MD (US); Howell George Henry, Ellicott City, MD (US); Bettina Nechay, Laurel, MD (US); Harlan Carl Cramer, Columbia, MD (US); Matthew Russell King, Linthicum, MD (US); Shalini Gupta, Falls Church, VA (US); Ronald G. Freitag, Catonsville, MD (US); Karen Marie Renaldo, Pasadena, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 206 days.

(21) Appl. No.: 14/509,750

(22) Filed: Oct. 8, 2014

(65) Prior Publication Data

US 2016/0104703 A1 Apr. 14, 2016

(51) Int. Cl.
*H01L 29/15* (2006.01)
*H01L 27/088* (2006.01)
(Continued)

(52) U.S. Cl.
CPC ...... *H01L 27/0883* (2013.01); *H01L 21/3081* (2013.01); *H01L 21/3086* (2013.01);
(Continued)

(58) Field of Classification Search
CPC .............. H01L 29/0657; H01L 29/0665; H01L 29/0676; H01L 29/2003; H01L 29/66446;
(Continued)

(56) References Cited

U.S. PATENT DOCUMENTS 7,439,139 B2 * 10/2008 Seliskar .......... H01L 21/823437
257/E21.19
7,655,546 B2 2/2010 Wohlmuth
(Continued)

OTHER PUBLICATIONS

Im et al., "High-Performance GaN-Based Nanochannel FinFETs With/Without AlGaN/GaN Heterostructure", IEEE Transactions on Electron Devices 60 (2013) pp. 3012-3018.*
(Continued)

*Primary Examiner* — Jay C Kim
(74) *Attorney, Agent, or Firm* — Tarolli, Sundheim, Covell & Tummino LLP

(57) ABSTRACT

A circuit is provided that includes a castellated channel device that comprises a heterostructure overlying a substrate structure, a castellated channel device area formed in the heterostructure that defines a plurality of ridge channels interleaved between a plurality of trenches, and a three-sided castellated conductive gate contact that extends across the castellated channel device area. The three-sided gate contact substantially surrounds each ridge channel around their tops and their sides to overlap a channel interface of heterostruc-
(Continued)

ture of each of the plurality of ridge channels. The three-sided castellated conductive gate contact extends along at least a portion of a length of each ridge channel.

6 Claims, 8 Drawing Sheets

(51) Int. Cl.
*H01L 21/8252* (2006.01)
*H01L 21/308* (2006.01)
*H01L 29/66* (2006.01)
*H01L 29/778* (2006.01)
*H01L 27/06* (2006.01)
*H01L 29/20* (2006.01)
*H01L 29/06* (2006.01)

(52) U.S. Cl.
CPC ...... *H01L 21/8252* (2013.01); *H01L 27/0605* (2013.01); *H01L 29/66462* (2013.01); *H01L 29/7786* (2013.01); *H01L 29/0657* (2013.01); *H01L 29/2003* (2013.01)

(58) Field of Classification Search
CPC ......... H01L 29/66462; H01L 29/66469; H01L 29/785
USPC .......................................................... 257/76
See application file for complete search history.

(56) References Cited

U.S. PATENT DOCUMENTS

| | | | |
|---|---|---|---|
| 7,714,384 B2* | 5/2010 | Seliskar | H01L 21/84 257/331 |
| 7,719,058 B2* | 5/2010 | Seliskar | H01L 21/823487 257/347 |
| 7,750,369 B2* | 7/2010 | Ohta et al. | 257/192 |
| 7,972,915 B2 | 7/2011 | Chen et al. | |
| 7,985,637 B2* | 7/2011 | Okamoto | H01L 21/30617 257/E21.403 |
| 8,138,544 B2* | 3/2012 | Seliskar | H01L 21/845 257/330 |
| 8,426,892 B2* | 4/2013 | Imanishi | H01L 21/02378 257/192 |
| 8,455,948 B2* | 6/2013 | Weis | H01L 21/823418 257/194 |
| 8,969,921 B2* | 3/2015 | Okamoto | H01L 21/8252 257/201 |
| 8,987,090 B2* | 3/2015 | Lemke | H01L 29/0649 257/330 |
| 9,142,400 B1* | 9/2015 | Brueck | H01L 21/02107 |
| 9,373,688 B2* | 6/2016 | Curatola | H01L 29/42316 |
| 9,461,160 B2* | 10/2016 | Then | H01L 29/66462 |
| 9,660,064 B2* | 5/2017 | Dasgupta | H01L 21/30617 |
| 2006/0214187 A1* | 9/2006 | Mita | H01L 29/66462 257/194 |
| 2013/0099247 A1 | 4/2013 | Palacios et al. | |
| 2014/0084299 A1* | 3/2014 | Schelling | H01L 29/42372 257/76 |
| 2015/0236134 A1* | 8/2015 | Zhong | H01L 29/665 438/157 |

OTHER PUBLICATIONS

Im et al., "Characteristics of GaN and AlGaN/GaN FinFETs", Solid-State Electronics 97 (2014) pp. 66-75.*
Im et al., "Performance improvement of normally off AlGaN/GaN FinFETs with fully gate-covered nanochannel", Solid-State Electronics 89 (2013) pp. 124-127.*
Liu et al., "Enhancement-Mode Operation of Nanochannel Array (NCA) AlGaN/GaN HEMTs", IEEE Electron Device Letters 33 (2012) pp. 354-356.*
Yadav et al., "Modeling of GaN-Based Normally-Off FinFET", IEEE Electron Device Letters 35 (2014) pp. 612-614.*
Chen et al., "Studying the short channel effect in the scaling of the AlGaN/GaN nanowire transistors", Journal of Applied Physics 113 (2013) 214501.*
Tsutsui, "GaN based power transistors: Proposals for low-loss operations", WIMNACT-39 (2014) pp. 1-26.*
Ohi, "Current Stability in Multi-Mesa-Channel AlGaN/GaN HEMTs", IEEE Transactions on Electron Devices 60 (2013) pp. 2997-3004.*
Lu, et al.: "*Low Leakage Normally-Off Tri-Gate GaN MISFET*", Proceedings of the 2012 24th International Symposium on Power semiconductor Devices and ICs, Jun. 3-7, 2012, Bruges, Belgium.

* cited by examiner

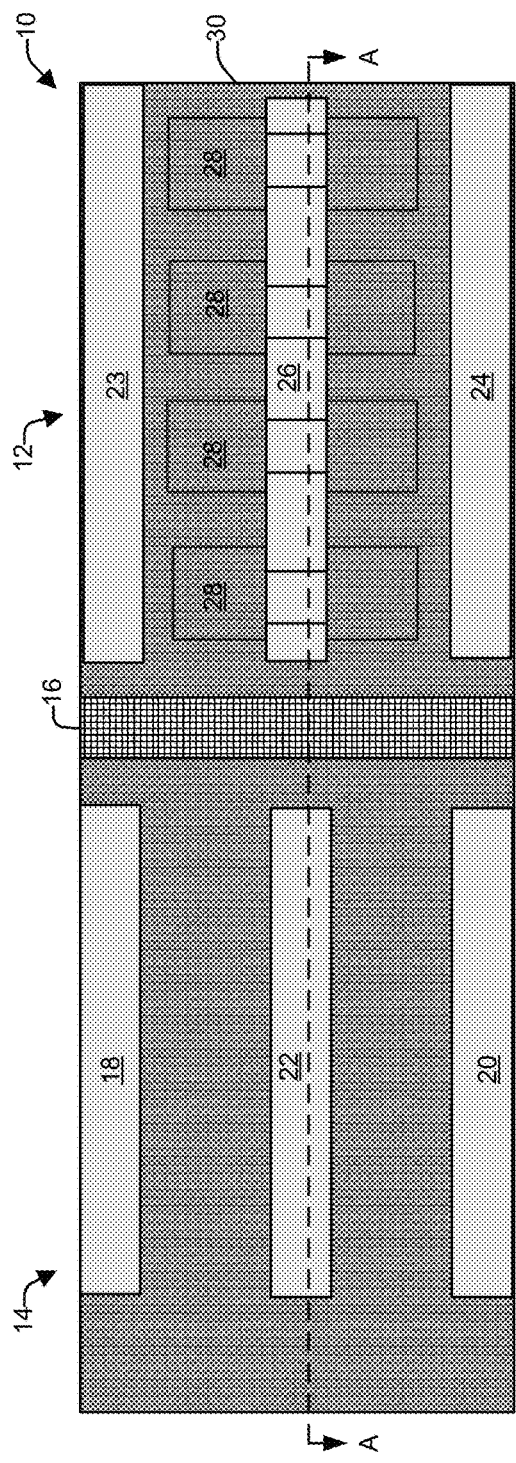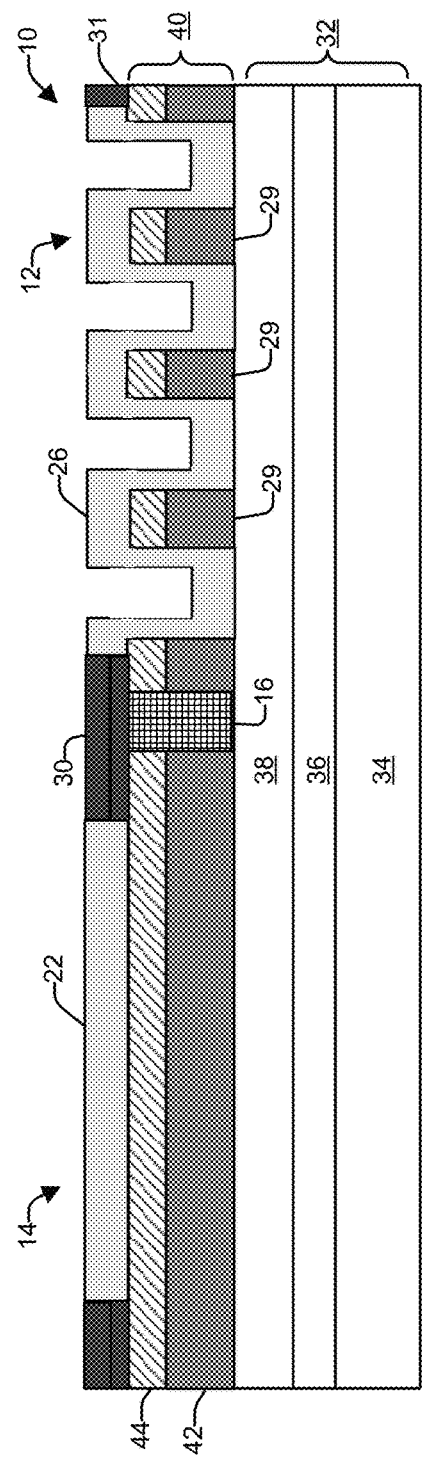

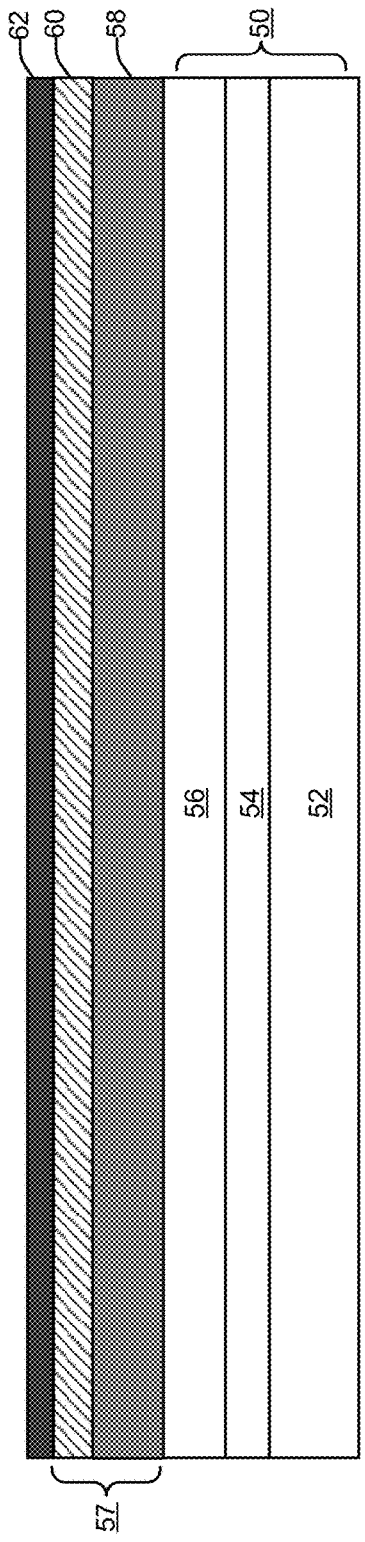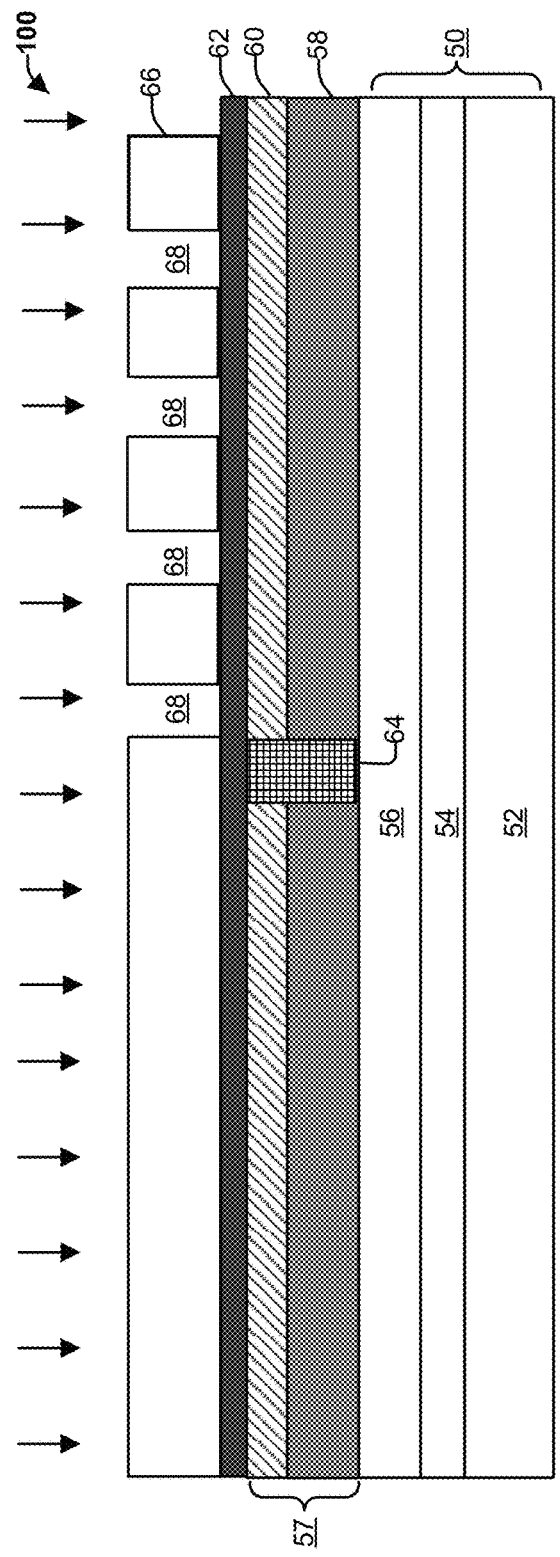

INTEGRATED ENHANCEMENT MODE AND DEPLETION MODE DEVICE STRUCTURE AND METHOD OF MAKING THE SAME

TECHNICAL FIELD

The present invention relates generally to electronics, and more particularly to an integrated enhancement mode and depletion mode device structure and method of making the same.

BACKGROUND

Certain heterostructure materials, such as Aluminum Gallium Nitride (AlGaN) and Gallium Nitride (GaN), create an electron well (i.e., a sheet of electrons) at the interface between the two dissimilar materials resulting from the piezoelectric effect and spontaneous polarization effect therebetween. The resulting sheet of electrons that forms at this interface is typically referred to as a Two-Dimensional Electron Gas ("2DEG") channel. An equally applicable heterostructure could have a plurality of two-dimensional hole gas (2DHG) channels. Both types of heterostructures can be referred to as "2DxG channel(s)" devices. FETs that operate by generating and controlling the electrons in the 2DxG channel are conventionally referred to as high electron mobility transistors ("HEMTs"). Typical GaN HEMTs will be conductive when zero volts is applied to the gate (also called "normally on"), and require a negative gate bias to turn them off. This type of operation is known as depletion mode, or d-mode, operation. However, many applications require a device which is non-conductive when zero volts is applied to the gate ("normally off"), with a positive gate bias required to turn them on. This mode of operation is known as enhancement mode, or e-mode, operation.

Typically, GaN circuits interface with silicon-based complimentary metal oxide semiconductor (CMOS) devices to provide both d-mode and e-mode operation in the same module. Operation of Silicon (Si) CMOS circuitry with GaN HEMT devices currently requires the use of level shifters due to the differing polarity and magnitude of gate voltages employed on the Si and GaN devices. These level shifters could be eliminated if the e-mode devices could be implemented in the GaN circuits. Furthermore, recent schemes in DC-DC power conversion involve class E amplifiers driven by d-mode HEMTs with drain voltages modulated by buck converters that are, by necessity, also driven by d-mode HEMTs. These buck converters could operate more efficiently with e-mode HEMTs.

SUMMARY

In one example, a circuit is provided that includes a castellated channel device that comprises a heterostructure overlying a substrate structure, a castellated channel device area formed in the heterostructure that defines a plurality of ridge channels interleaved between a plurality of trenches, and a three-sided castellated conductive gate contact that extends across the castellated channel device area. The three-sided gate contact substantially surrounds each ridge channel around their tops and their sides to overlap a channel interface of heterostructure of each of the plurality of ridge channels. The three-sided castellated conductive gate contact extends along at least a portion of a length of each ridge channel.

In another example, an integrated circuit is provided that comprises a planar channel device comprising a first portion of a single shared heterostructure overlying a substrate structure in a planar channel device area, and having a planar gate contact that is in contact with the first portion of the single shared heterostructure, and a castellated channel device comprising a second portion of the single shared heterostructure overlying the substrate structure in a castellated channel device area, and having a castellated gate contact that substantially surrounds a channel interface of each ridge channel of a castellated channel in the castellated channel device area.

In yet a further example, a method of forming an integrated circuit is provided. The method comprises forming a heterostructure over a substrate structure, etching a castellated channel region in an e-mode device area of the heterostructure that defines a plurality of ridge channels interleaved between a plurality of trenches, and forming a mask with an opening that defines a castellated gate opening overlying the castellated channel region. The method further comprises performing a contact fill to form a castellated gate contact that extends across the castellated channel region and substantially surrounds each of the plurality of ridge channels around their top and their sides to overlap a channel interface of heterostructure of each of the plurality of ridge channels, such that the castellated gate contact extends along at least a portion of a length of each ridge channel, and removing the mask.

BRIEF DESCRIPTION OF THE DRAWINGS

FIG. 1 illustrates a plan view of an example of an integrated e-mode and d-mode channel device structure.

FIG. 2 illustrates a cross-sectional view (planar slice) of the structure of FIG. 1 along its center line A-A.

FIG. 3 illustrates a cross-sectional view of an example of an epitaxial structure in its early stages of fabrication.

FIG. 4 illustrates a cross-sectional view of an example of the structure of FIG. 3 after a photoresist deposition and patterning and while undergoing a deposition process.

DETAILED DESCRIPTION

Figure 5:
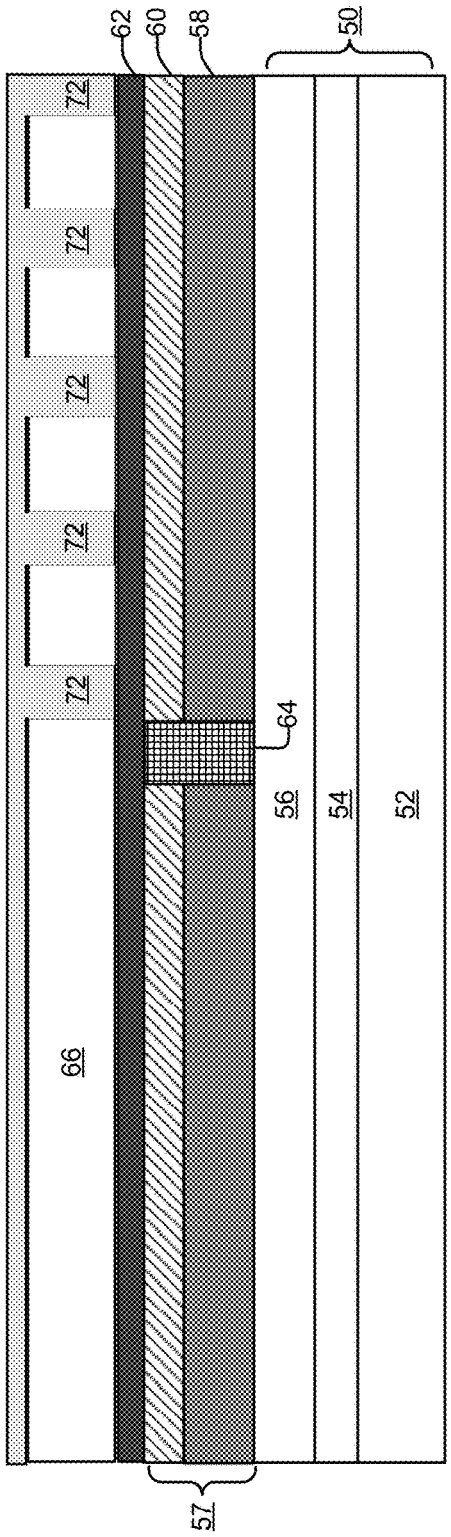
FIG. 5 illustrates a cross-sectional view of an example of the structure of FIG. 4 after the deposition process.

The present disclosure is directed to a technique for simultaneously fabricating integrated gallium nitride (GaN) circuits containing both enhancement mode (e-mode) and depletion mode (d-mode) high electron mobility transistors ("HEMTs") on the same integrated circuit or wafer, thus increasing the versatility and performance of GaN-based circuits. One or more e-mode HEMTs are formed having a channel with a castellated gate contact that substantially surrounds a castellated channel of a given e-mode HEMT with gate metal on the sides as well as the top of the channel causing the channel to be depleted or normally-off even with zero bias on the gate. A positive voltage is required to turn the HEMT on rendering it as an e-mode device. The e-mode HEMT could be a castellated single channel device formed from one or more castellated ridges with a castellated gate contact that substantially surrounds each castellated ridge along at least a portion of its gate length with gate metal. One or more d-mode HEMTs are formed concurrently with the forming of the one or more e-mode HEMTs. The one or more d-mode HEMTs are each formed with a single planar gate contact disposed above a planar single channel in which the planar single channel devices are in a normally on state in which a negative voltage is required to turn the d-mode HEMT off.

Utilizing the technique described herein, a circuit fabricated with an integrated e-mode/d-mode process could contain d-mode class E amplifiers and e-mode buck converters to achieve similar results with greater efficiency. The benefits of a combined e-mode/d-mode GaN circuit would eliminate the need to interface with CMOS logic circuits by enabling the fabrication of logic circuits directly on the GaN chip. Therefore, level shifters can be eliminated where CMOS integration is still desirable. Additionally, mixed-signal and RF circuits can be simplified, and power converters and pulse width modulators would operate more efficiently. Thus, present disclosure facilitates the integration of power devices employing GaN on SiC with Si CMOS logic devices that can operate as a control for RF circuits or could form part of a mixed-signal (digital/analog) circuit. Furthermore, efficient DC-DC power conversion on GaN circuits is possible.

FIG. 1 illustrates a plan view of an example of an integrated e-mode and d-mode channel device structure 10. FIG. 2 illustrates a cross-sectional view (planar slice) of the structure of FIG. 1 along its center line A-A. The device structure 10 includes a castellated channel HEMT device 12 located in an e-mode device area adjacent and isolated by an isolation region 16 from a planar channel HEMT device 14 located in a d-mode device area. The planar channel device 14 includes a single shared heterostructure 40 channel of an AlGaN layer 44 overlying a GaN layer 42. The castellated channel device 12 also includes a channel formed from a plurality of channel ridges 29 of the same single shared heterostructure structure 40 of the AlGaN layer 44 overlying the GaN layer 42.

Although the present example is illustrated with respect to employing a layer of AlGaN overlying a layer of GaN to form a heterostructure, a variety of heterostructures could be employed as long as the heterostructure comprises two layers of dissimilar materials designed to create a sheet of electrons (i.e. a 2DEG channel) or a sheet of holes (i.e., a 2DHG channel) at the interface between the two dissimilar materials. Various heterostructure materials are known to produce 2DEG and 2DHG channels at the interface therebetween, including but not limited to Aluminum Gallium Nitride (AlGaN) and Gallium Nitride (GaN), Aluminum Gallium Arsenide (AlGaAs) and Gallium Arsenide (GaAs), Indium Aluminum Nitride (InAlN) and Gallium Nitride (GaN), alloys of Silicon (Si) and Germanium (Ge), and noncentrosymmetric oxidesheterojunction overlying a base structure.

The castellated channel device 12 includes a castellated gate contact 26 that substantially surrounds the three sides of each ridge channel 29 of the castellated channel device 12 across at least a portion of its gate length, and is formed in a castellated gate region across castellated trenches 28 that extend along the castellated channel device 12. The castellated gate contact 26 facilitates device on/off control and makes the castellated channel device an e-mode device that needs a positive voltage to turn it on. One example of a castellated channel device with a castellated gate is illustrated in commonly owned U.S. patent application Ser. No. 13/802,747 filed on Mar. 14, 2013, entitled, "Superlattice Crenellated Gate Field Effect Transistor", the entire contents of which is incorporated herein. The planar channel device 14 includes a planar gate contact 22. The gate contacts 22 and 26 can be made of a conventional contact material comprising layers of nickel and gold, as known in the art. Other gate contacts compositions will be apparent to those skilled in the art. Drain contact 18 and source contact 20 of the planar channel device 14, and drain contact 22 and source contacts 24 of the castellated channel device 12 can be made in subsequent processing steps. A first and second capping layer 31 and 30 serve as protective layers or masking layers during processing of the castellated channel device 12 and the planar channel device 14.

The castellated channel device 12 and the planar channel device 14 overly a base structure 32. The base structure 32 can comprise a substrate layer 34, a nucleation layer 36 and a buffer layer 38 of, for example, silicon carbide (SiC), aluminum nitride (AlN) and aluminum gallium nitride (AlGaN), respectively. Optionally, the base structure 32 can comprise a substrate layer 34 of sapphire, a nucleation layer 36 comprising a combination of a low-temperature GaN layer and a high-temperature GaN layer, and a buffer layer 38. The base structure 32 can alternatively comprise a substrate layer 34 of (111)-orientated crystalline silicon, a nucleation layer 36 comprising AlN and a buffer layer 38 comprising a series of discrete AlGaN layers (typically between two and eight layers), each discrete layer having a different aluminum composition. Other base structures will be apparent to those skilled in the art.

The percentage of aluminum in the AlGaN layer 44 can range from about 0.1 to 100 percent. For example, the percentage of aluminum in the AlGaN layer 44 can be between about 20% and 100% aluminum-content aluminum gallium nitride.

Turning now to FIGS. 2-15, fabrication is discussed in connection with formation of integrated e-mode and d-mode device as illustrated in FIGS. 1-2. FIG. 3 illustrates a cross-sectional view of an epitaxial structure in its early stages of fabrication. The epitaxial structure includes a single shared heterojunction structure 57 overlying a base structure 50. As stated above, the base structure 50 can comprise a substrate layer 52, a nucleation layer 54 and a buffer layer 56 formed of a variety of different materials as described above. The single shared heterojunction structure 57 is formed of an AlGaN layer 60 overlying a GaN layer 58. The GaN layer 58 is deposited over the base structure 50 and the AlGaN layer 60 is deposited over the GaN layer 58. Any suitable technique for depositing each layer can be employed such as metal organic chemical vapor deposition (MOVCD), molecular beam epitaxy (MBE) or other suitable deposition techniques. A first capping layer 62 (e.g., $Si_3N_4$) is deposited over the AlGaN layer 60 by, for example, by plasma enhanced chemical vapor deposition (PECVD) or MOCVD.

An isolation region is formed 64 (FIG. 4) to isolate the portion of the single shared heterostructure 57 that forms parts of the planar channel device in a d-mode device area from portions of the shared heterostructure 57 that forms part of the castellated channel device in a e-mode device area. The isolation region 64 can be formed by patterning a photoresist opening and an ion implantation process, for example, whereby helium atoms can be shot at a high velocity into the heterostructure 57 to disrupt its crystalline geometry, thereby eliminating the 2DEG channel effectivity within the isolated region 64 and render non-operable those 2DEG channels contained in the isolation regions. Alternatively, a mesa etch can be performed to achieve the same result. This same procedure can be performed on other portions of the structure to isolate the castellated channel device and planar channel device from other devices on the integrated circuit or wafer.

Next, a masking layer 66 (FIG. 4) is deposited over the first capping layer 62 and patterned and developed to provide trench openings 68 over a channel area of the structure where the enhancement mode devices are to be formed. Only devices which are intended as enhancement mode devices would be patterned. Depletion mode devices would remain fully covered with the masking material.

Figure 6:
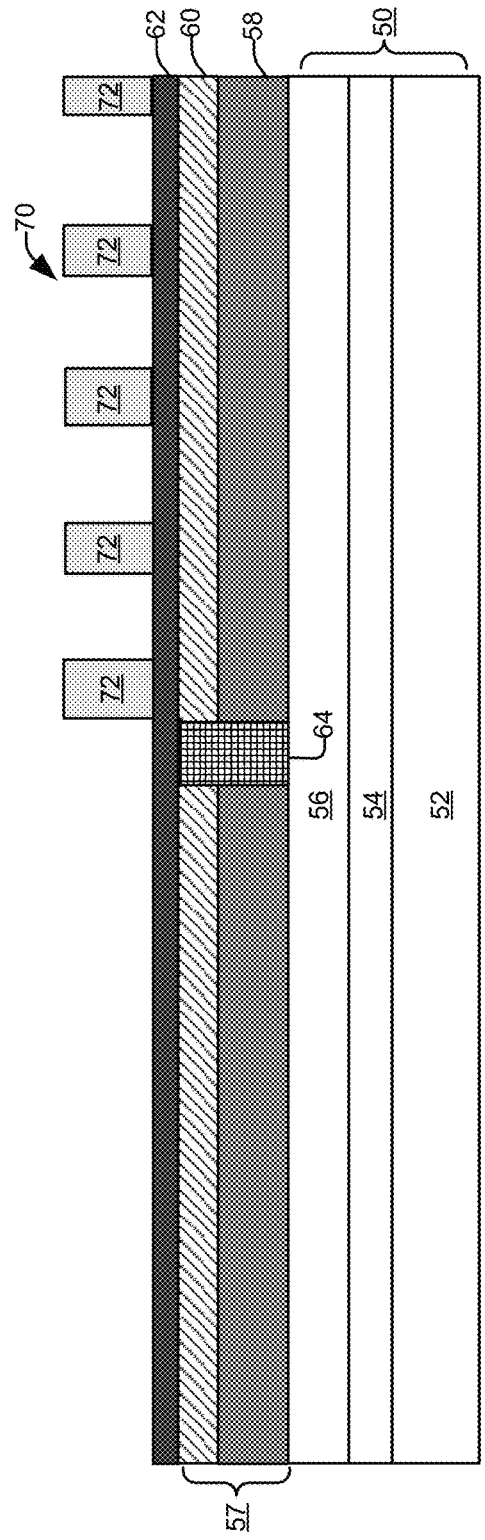
FIG. 6 illustrates a cross-sectional view of an example of the structure of FIG. 5 after undergoing a tape lift off of a portion of the hard mask material and removal of the photoresist material layer to leave a resultant hard mask.
Figure 7:
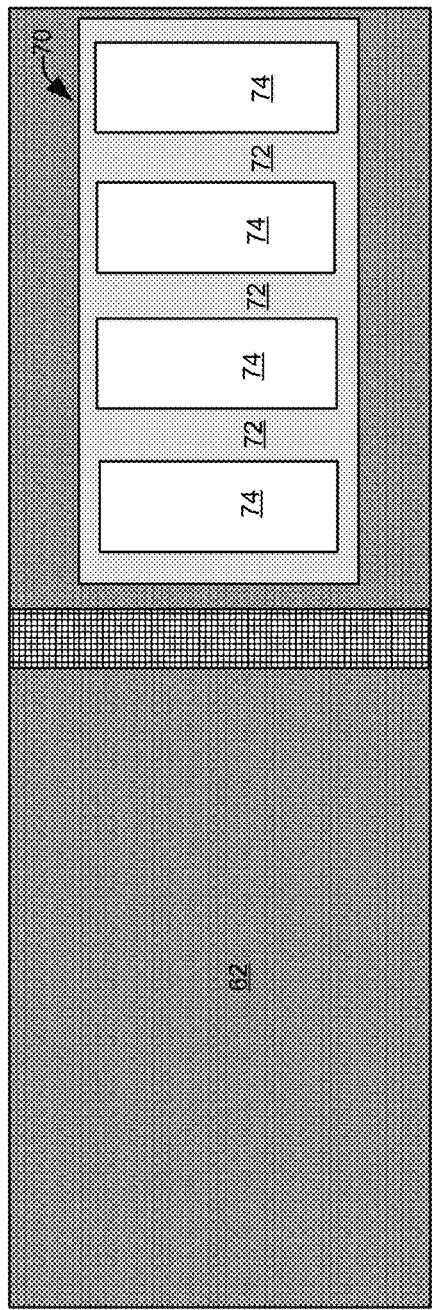
FIG. 7 illustrates a plan view of the structure of FIG. 6.

FIG. 4 also illustrates the structure of FIG. 3 undergoing a deposition process 100 in which the trench openings are filled with a hard mask material, such as for example, a thick layer of nickel or the like. The resultant structure after the deposition process 100 is illustrated in cross-sectional view of FIG. 5. FIG. 6 illustrates a cross-sectional view of the structure of FIG. 5 and FIG. 7 illustrate a plan view of the structure of FIG. 5 after undergoing a tape lift off of a portion of the hard mask material and removal of the photoresist material layer 66 to leave a resultant hard mask 70. The hard mask includes covered ridge regions 72 that protect the underlying ridge channels where the castellated channels will reside and uncovered regions that provide trench openings 74 in the channels to form an underlying castellated non-channel regions. Alternatively, a hard mask material such as silicon oxide ($SiO_2$) or silicon nitride (SiN) can be deposited over the first capping layer 62 followed by a depositing and patterning of photoresist material with a subsequent etching and stripping to form the resultant hard mask 70.

Figure 8:
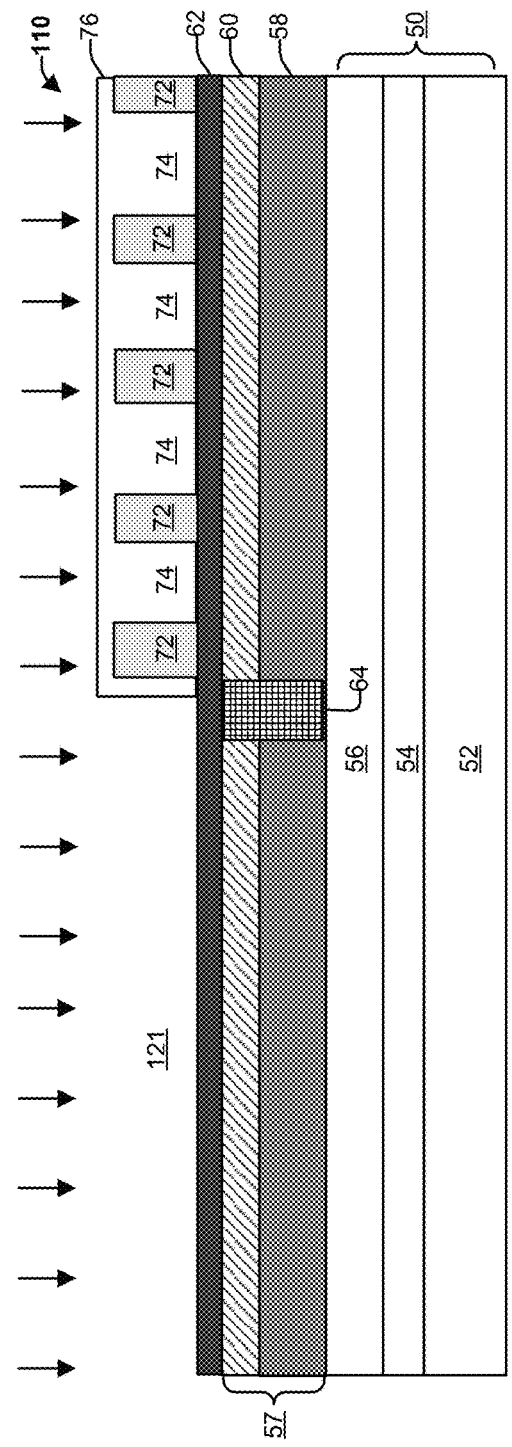
FIG. 8 illustrates a cross-sectional view of an example of the structure of FIG. 6 after a photoresist deposition and patterning and while undergoing a deposition process.
Figure 9:
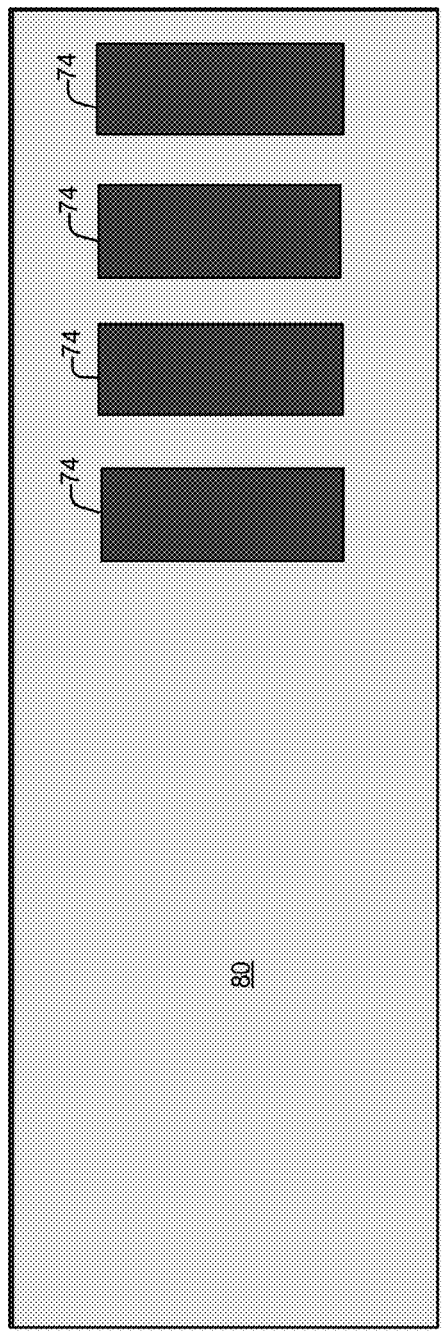
FIG. 9 illustrates a plan view of the structure of FIG. 8 after tape lift off of a portion of the hard mask material and removal of the photoresist material layer.
Figure 10:
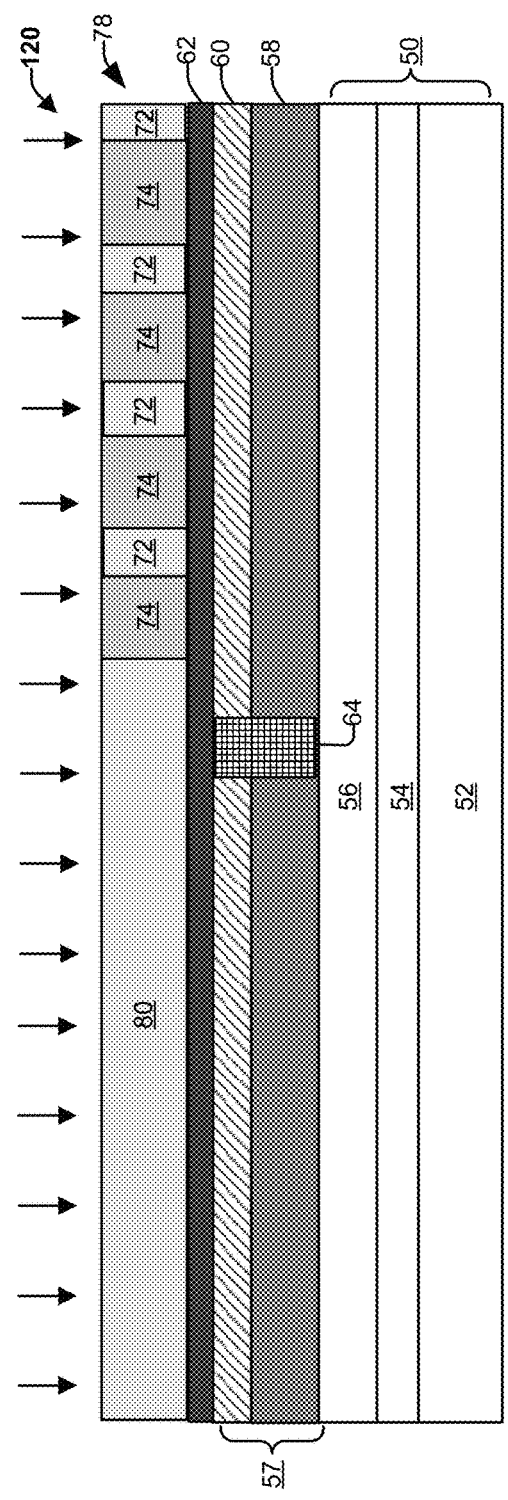
FIG. 10 illustrates a cross-sectional view of an example of the structure of FIG. 8 after tape lift off of the photoresist material layer and while undergoing an etching process.

Next as shown in FIG. 8, a photoresist material layer 76 is deposited and patterned and developed via optical lithography to cover and protect the channel region of the enhancement mode device, while also providing open regions 121 over the entire integrated structure excluding the channel region of the enhancement mode device. FIG. 8 also illustrates the structure of FIG. 7 undergoing a deposition process 110 in which the open regions 121 are filled with a hard mask material. The nickel will stick everywhere except on the previously patterned channel region, including on devices intended to be d-mode devices. A tape lift off of the hard mask material and removal of the photoresist material is performed to leave a resultant hard mask 80 that maintains trench openings 74 in the channel region of the enhancement mode device, and covers the integrated structure in all of the remaining regions. FIG. 9 illustrates a plan view after tape lift off, while FIG. 10 illustrates a cross-sectional view after the tape lift off. Again it is appreciated that the resultant hard mask 80 can be produced by other techniques as described above with respect to a $SiO_2$, or a SiN hard mask.

Figure 11:
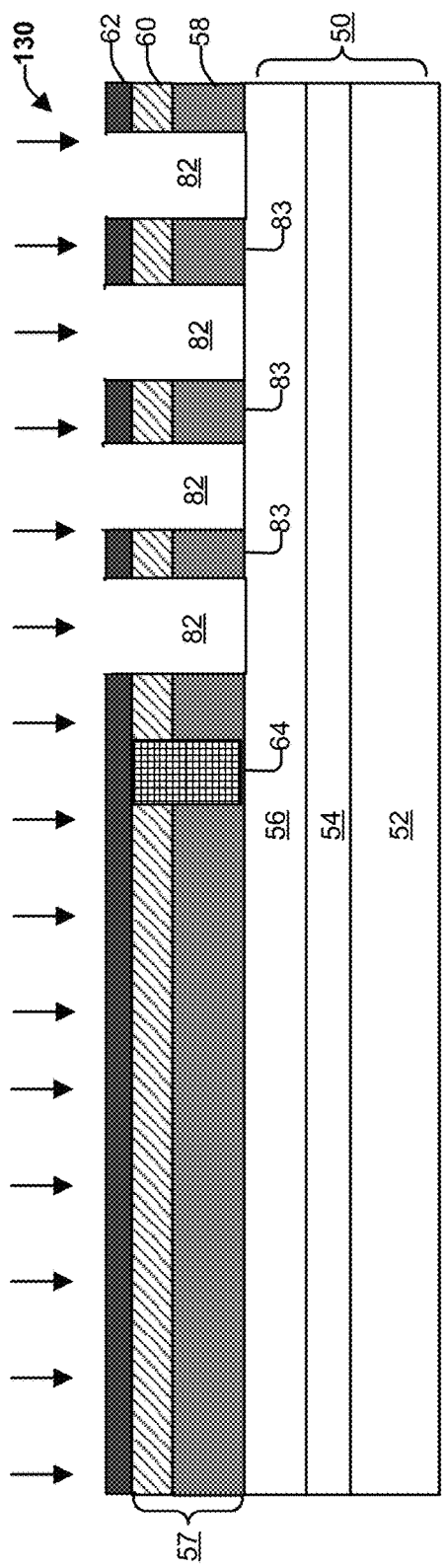
FIG. 11 illustrates a cross-sectional view of an example of the structure of FIG. 10 after the castellation formation, and while undergoing a deposition process.
Figure 12:
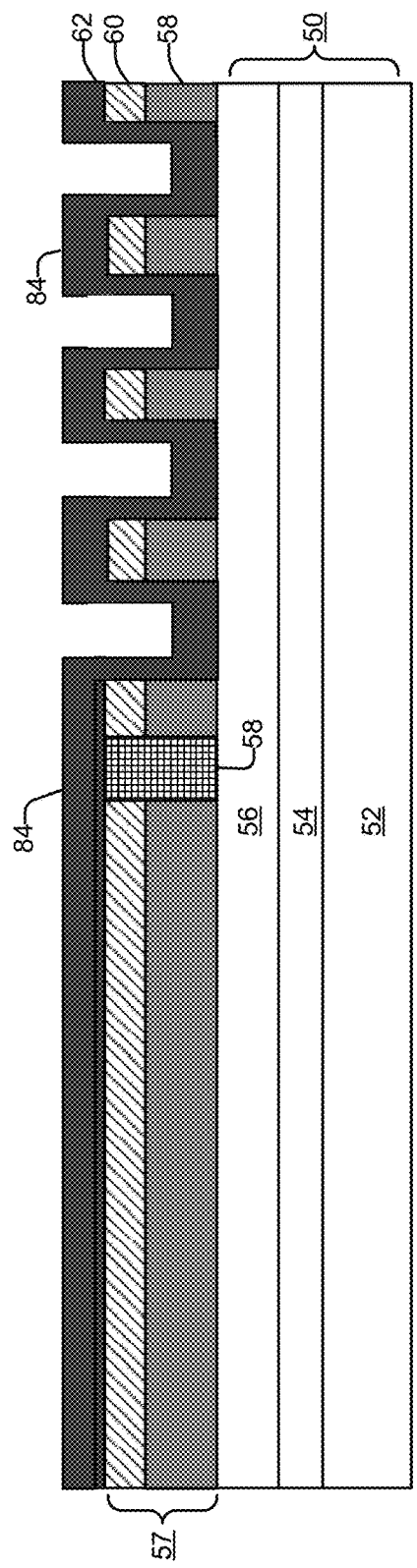
FIG. 12 illustrates a cross-sectional view of an example of the structure of FIG. 11 after undergoing the deposition process.

FIG. 10 also illustrates the structure undergoing an etching process 120 to form trenches 82 and ridges 83 in the channel region of the castellated channel device. The etching process 120 can include etching the channel region by an inductively coupled plasma (ICP) etcher to form "castellations" which allow the subsequently deposited metal gate to contact the channel from the sides. The hard mask 80 is then stripped leaving the resultant structure shown in FIG. 11. Also illustrated in FIG. 11, is the resultant structure undergoing a deposition process 130 to deposit a second capping layer 84 (FIG. 12), which can be a layer of $Si_3N_4$. The deposition process 130 can be a plasma enhanced chemical vapor deposition (PECVD) process to insulate the channel from the gate contact of the castellated channel device. The second capping layer 84 protects the channel region where the gate contact will not reside from a gate contact fill. The resultant structure after the deposition process 130 is shown in FIG. 12.

Figure 13:
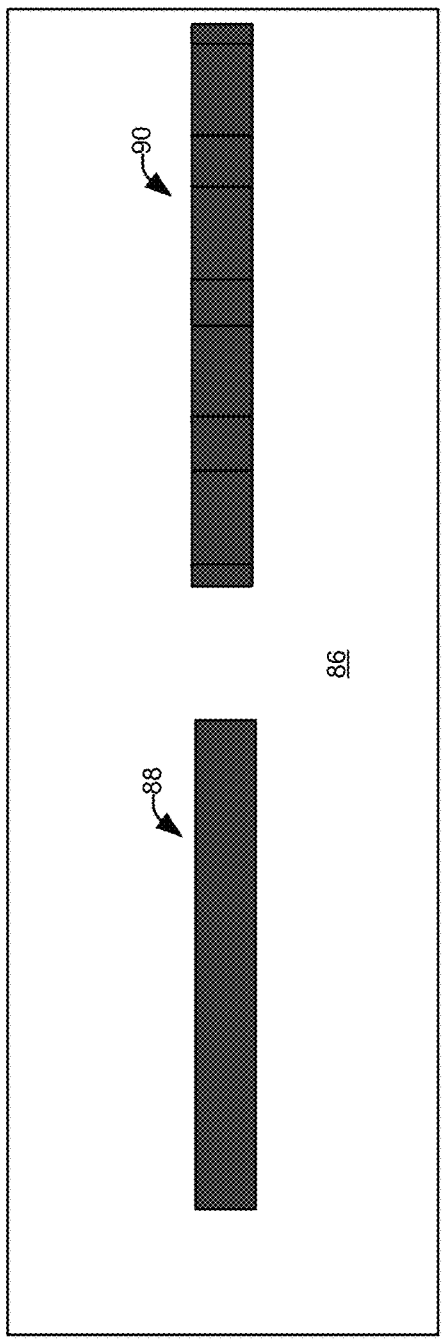
FIG. 13 illustrates a plan view of an example of the structure of FIG. 12 after deposition and patterning of a mask.
Figure 14:
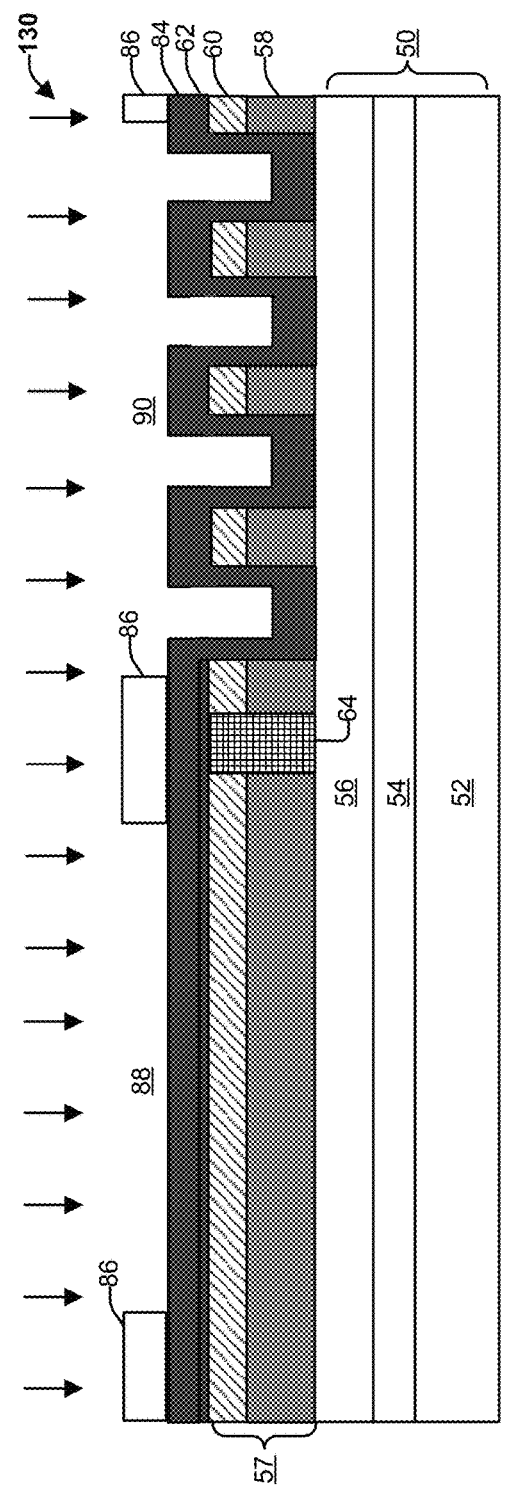
FIG. 14 illustrates a cross-sectional view of an example of the structure of FIG. 13 undergoing an etching process.
Figure 15:
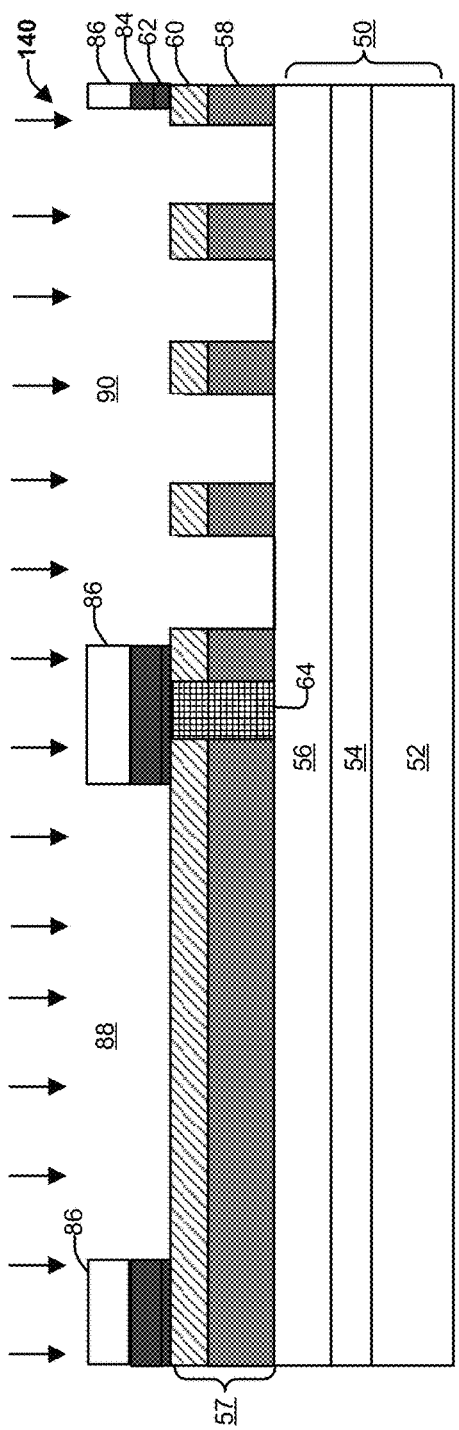
FIG. 15 illustrates a cross-sectional view of an example of the structure of FIG. 14 after undergoing an etching process, and while undergoing a contact fill.

Next, a photoresist 86 is deposited and patterned via electron beam lithography to define opening 88 for the planar channel device and opening 90 for the castellated channel device, as shown in the plan view of FIG. 13. FIG. 14 illustrates a cross-sectional view of the structure illustrated in FIG. 13 along its center line undergoing an etching process 130 to etch the second capping layer 84 and the first capping layer 62 with an ICP etcher, stopping on the AlGaN barrier layer 60 to form a gate contact opening 88 in the planar channel device and a castellated gate contact opening 90 in the castellated channel device to provide the resultant structure in FIG. 15. All devices, whether enhancement mode or depletion mode, can be etched in this manner.

Figure 16:
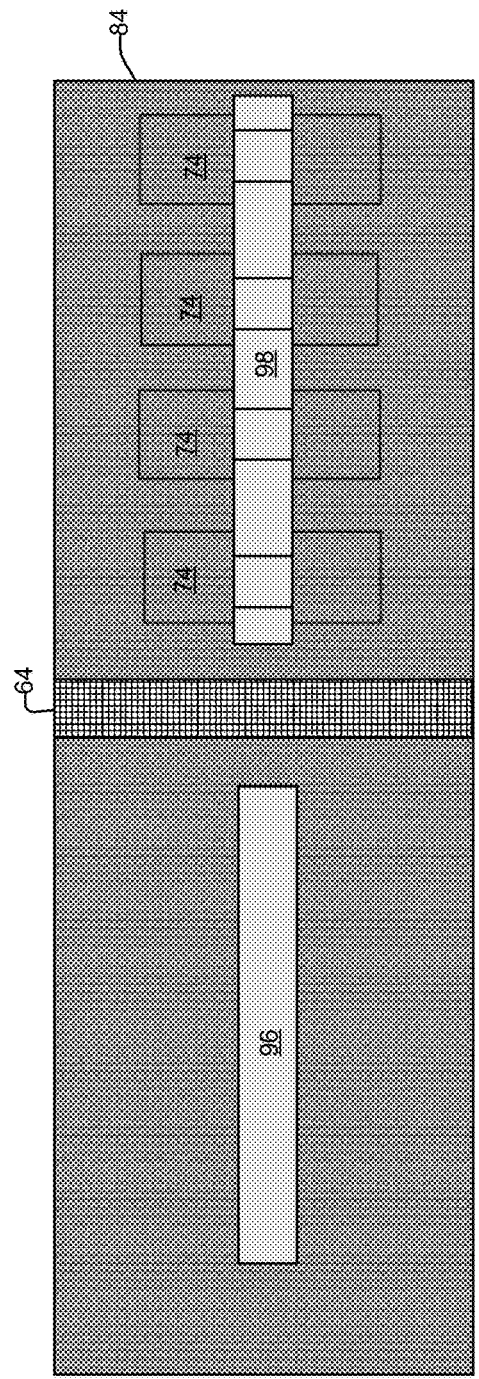
FIG. 16 illustrates a plan view of an example of the structure of FIG. 15 after undergoing the contact fill.

A gate contact fill 140 (FIG. 15) is performed to fill the gate contact openings 88 and 90 with a conductive material to form castellated gate contacts that surrounds three sides of the castellated channel device and a planer gate for the planar channel device as illustrated in FIGS. 1-2. A dielectric layer can be deposited to fill the gate contact openings 92 and 94 prior to the gate contact fill 140 to facilitate the reduction in leakage current by the resultant device structures. The gate contacts can be made of a conventional contact material comprising layers of nickel and gold, as known in the art. Other gate contacts compositions will be apparent to those skilled in the art. Subsequently or concurrently drain and source contacts can be formed and an overlying passivation layer deposited over the final structure to form the final integrated planar channel device and castellated channel device. The photoresist material layer 86 and gate contact material layer (not shown) grown over the photoresist material layer 86 is stripped or taped lifted off to provide the resultant structure illustrated in the plan view of FIG. 16.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A circuit comprising:
   a castellated channel device comprising:
      a heterostructure overlying an underlying structure, the underlying structure comprising a given semiconducting material;
      a castellated channel device area formed in the heterostructure that defines a plurality of ridge channels comprising another semiconducting material formed over the underlying structure, the plurality of ridge channels being interleaved between a plurality of trenches, wherein a top planar semiconductor surface of the given semiconductor material in the underlying structure between ridge channels is exposed in each of the plurality of trenches; and
      a three-sided castellated conductive gate contact that extends across the castellated channel device area and substantially surrounds each ridge channel around its top and its sides to overlap a channel interface of each of the plurality of ridge channels, the three-sided castellated conductive gate contact extending along at least a portion of a length of each ridge channel;
   a planar channel device formed from a first portion of a single shared heterostructure overlying the underlying structure in a planar channel device area, and having a planar gate contact that is in contact with the first portion of the single shared heterostructure, wherein the single shared heterostructure forms the heterostructure of the castellated channel device; and
   an isolation region in the single shared heterostructure that electrically isolates the planar channel device from the castellated channel device.

2. The circuit of claim 1, wherein the single shared heterostructure comprises an aluminum gallium nitride (AlGaN) layer overlying a gallium nitride layer (GaN).

3. The circuit of claim 1, wherein the planar channel device is a d-mode device and the castellated channel device is an e-mode device.

4. An integrated circuit comprising:
   a planar channel device comprising a first portion of a single shared heterostructure overlying an underlying structure in a planar channel device area, and having a planar gate contact that is in contact with the first portion of the single shared heterostructure, wherein the underlying structure is formed of a given semiconducting material; and
   a castellated channel device comprising a second portion of the single shared heterostructure overlying the underlying structure in a castellated channel device area, and having a castellated gate contact that extends to contact a top surface of the underlying structure and substantially surrounds a channel interface of each ridge channel of a castellated channel in the castellated channel device area, wherein each ridge channel is formed of another semiconducting material, the castellated channel device area also having a plurality of trenches, wherein each trench exposes a top planar semiconductor surface of the given semiconductor material in the underlying structure and each of the plurality of trenches is juxtaposed with at least one of the ridge channels;
   an isolation region in the single shared heterostructure that electrically isolates the planar channel device from the castellated channel device.

5. The circuit of claim 4, wherein the single shared heterostructure comprises an aluminum gallium nitride (AlGaN) layer overlying a gallium nitride layer (GaN).

6. The circuit of claim 4, wherein the planar channel device is a d-mode device and the castellated channel device is an e-mode device.

* * * * *